United States Patent
Uemura et al.

(10) Patent No.: US 7,005,684 B2
(45) Date of Patent: Feb. 28, 2006

(54) GROUP III NITRIDE BASED SEMICONDUCTOR LUMINESCENT ELEMENT

(75) Inventors: Toshiya Uemura, Aichi (JP); Shigemi Horiuchi, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/479,602

(22) PCT Filed: Jun. 3, 2002

(86) PCT No.: PCT/JP02/05430

§ 371 (c)(1),
(2), (4) Date: Dec. 4, 2003

(87) PCT Pub. No.: WO02/101841

PCT Pub. Date: Dec. 19, 2002

(65) Prior Publication Data

US 2004/0149999 A1    Aug. 5, 2004

(30) Foreign Application Priority Data

Jun. 6, 2001   (JP) .............................. 2001-170908

(51) Int. Cl.
*H01L 29/22*   (2006.01)
(52) U.S. Cl. .................... 257/99; 257/94; 257/745
(58) Field of Classification Search .................. 257/94, 257/99, 745
See application file for complete search history.

(56) References Cited

U.S. PATENT DOCUMENTS

| | | | |
|---|---|---|---|
| 5,006,908 A | 4/1991 | Matsuoka et al. ............ 257/76 |
| 5,563,422 A | 10/1996 | Nakamura et al. ............ 257/13 |
| 6,060,730 A * | 5/2000 | Tsutsui ........................ 257/103 |
| 6,172,382 B1 * | 1/2001 | Nagahama et al. ........... 257/94 |
| 6,232,623 B1 * | 5/2001 | Morita ........................ 257/103 |
| 6,278,173 B1 * | 8/2001 | Kobayashi et al. ......... 257/627 |
| 6,333,522 B1 * | 12/2001 | Inoue et al. .................. 257/99 |
| 6,335,218 B1 * | 1/2002 | Ota et al. ..................... 438/46 |
| 6,414,339 B1 * | 7/2002 | Tsutsui ........................ 257/99 |
| 6,445,011 B1 | 9/2002 | Hirano et al. |
| 6,577,006 B1 * | 6/2003 | Oota et al. .................. 257/745 |
| 6,711,191 B1 * | 3/2004 | Kozaki et al. ................ 372/43 |
| 6,713,877 B1 | 3/2004 | Hirano et al. |
| 6,800,501 B1 * | 10/2004 | Miki et al. .................... 438/29 |
| 2001/0038103 A1 * | 11/2001 | Nitta et al. .................. 257/103 |
| 2003/0038294 A1 * | 2/2003 | Sano ........................... 257/91 |

FOREIGN PATENT DOCUMENTS

| | | |
|---|---|---|
| CN | 1264181 A | 8/2000 |
| JP | 3-183173 | 8/1991 |
| JP | 5-129658 | 5/1993 |
| JP | 10125655 A * | 5/1998 |

(Continued)

OTHER PUBLICATIONS

Koide et al., Dependence of electrical properties on work functions of metals contacting to p-type GaN, 1997, Elsevier Science, Applied Surface Science, 373-79.*

(Continued)

*Primary Examiner*—Allan R. Wilson
(74) *Attorney, Agent, or Firm*—McGinn IP Law Group, PLLC

(57) ABSTRACT

In a flip chip type Group III nitride compound semiconductor light-emitting element, an Au layer is provided on each of a surface of a p-side electrode and a surface of an n-side electrode with interposition of a Ti layer.

21 Claims, 3 Drawing Sheets

FOREIGN PATENT DOCUMENTS

| | | | |
|---|---|---|---|
| JP | 10190055 A | * | 7/1998 |
| JP | 11054843 A | * | 2/1999 |
| JP | 11074558 A | * | 3/1999 |
| JP | 2000-164928 | | 6/2000 |
| JP | 2000-315819 | | 11/2000 |

OTHER PUBLICATIONS

Rennie et al., Effect of metal type on the contacts to n-type and p-type GaN, 1998, Elsevier Science, JOurnal of Crystal Growth, pp. 711-15.*

Chinese Office Action dated Aug. 26, 2005 (with English translation.) Chinese Application No. 02811199.0.

* cited by examiner

GROUP III NITRIDE BASED SEMICONDUCTOR LUMINESCENT ELEMENT

REFERENCE TO PRIOR APPLICATION

This application is the National Stage of International Application No. PCT/JP02/05430, filed on Jun. 3, 2002.

TECHNICAL FIELD

The present invention relates to a Group III nitride compound semiconductor light-emitting element. Particularly it relates to a Group III nitride compound semiconductor light-emitting element having a p-side electrode and an n-side electrode formed on one surface side and preferably used in a flip chip type light-emitting device.

BACKGROUND ART

There is known a (flip chip type) light-emitting device configured so that an element having a light-emitting layer of Group III nitride compound semiconductor is mounted on a support while a surface of the element on which a p-side electrode and an n-side electrode are formed is used as a mount surface. In this type light-emitting device, light emitted from the light-emitting layer of the light-emitting element passes through a light-transmissive substrate so as to be radiated to the outside. The electrodes of the light-emitting element are electrically connected to electrodes (an n layer and a p layer or wiring patterns) of the support through electrically conductive adhesive members respectively. High electric conductivity is required of the electrically conductive adhesive members. Generally, adhesive members of Au (Au bumps) are used as the electrically conductive adhesive members. Al, V, etc. can be used as the n-side electrode of the light-emitting element. On the other hand, Rh, etc. low in contact resistance and high in reflection efficiency can be used as the p-side electrode.

When Rh is used as the p-side electrode, adhesion of Rh to the Au bump is low. Therefore, a thick film of Au may be formed on a surface of the p-side electrode in advance to enhance adhesion of the p-side electrode to the Au bump. As a result, bonding strength between the light-emitting element and the support can be enhanced. When attention is paid to the n-side electrode, the surface of the n-side electrode is however made of Al etc. which is the material of the electrode. It cannot be said that bonding strength between the n-side electrode and the Au bump is sufficient. For this reason, there is still room for improvement in preservative characteristic or durability. There is also fear that a sufficient element function cannot be exhibited because failure occurs in bonding between the n-side electrode and the support. Furthermore, it is undesirable from the point of view of corrosion resistance that Al etc. which is the material of the electrode is exposed at the surface of the n-side electrode. When the electrodes one of which is made of Al while the other is made of Au have to be soldered, there is a further problem in solderability of the electrodes.

The invention is developed in consideration of the aforementioned problems and an object of the invention is to provide a Group III nitride compound semiconductor light-emitting element which is excellent in preservative characteristic or durability and which has a more stable element function.

DISCLOSURE OF THE INVENTION

To achieve the foregoing object, the invention is configured as follows. That is, according to the invention, there is provided a Group III nitride compound semiconductor light-emitting element having a p-side electrode and an n-side electrode formed on one surface side, the Group III nitride compound semiconductor light-emitting element further having: a p-side electrode film containing Au and formed on a surface of the p-side electrode; and an n-side electrode film containing Au and formed on a surface of the n-side electrode.

In the aforementioned configuration, a film containing a material (Au) of an adhesive member (Au bump) used for mounting the light-emitting element on a support is formed on each of a surface of the p-side electrode and a surface of the n-side electrode to improve adhesion between each of the two electrode surfaces and the adhesive member. As a result, when the light-emitting element is mounted on the support, bonding strength between the light-emitting element and the support is improved. Accordingly, stabilization of the element function is attained and preservative characteristic or durability is improved.

Furthermore, because a film containing Au is formed on each of the two electrode surfaces, corrosion resistance of each of the two electrode surfaces is improved. It can be said from this point of view that a Group III nitride compound semiconductor light-emitting element high in preservative stability or durability is provided.

As described above, in accordance with the configuration of the invention, a light-emitting element excellent in preservative characteristic or durability and having a more stable element function is provided.

Incidentally, in the aforementioned configuration, because films the same in configuration are formed on the two electrode surfaces, the color tones of the two electrode surfaces can be matched with each other. Accordingly, there is also provided an effect of attaining improvement in appearance recognition of a surface of the light-emitting element on which the two electrodes are formed, improvement in mount accuracy at the time of mounting the support on the light-emitting element having the surface used as a mount surface, improvement in efficiency in the mounting process, etc.

BEST MODE FOR CARRYING OUT THE INVENTION

Figure 1:
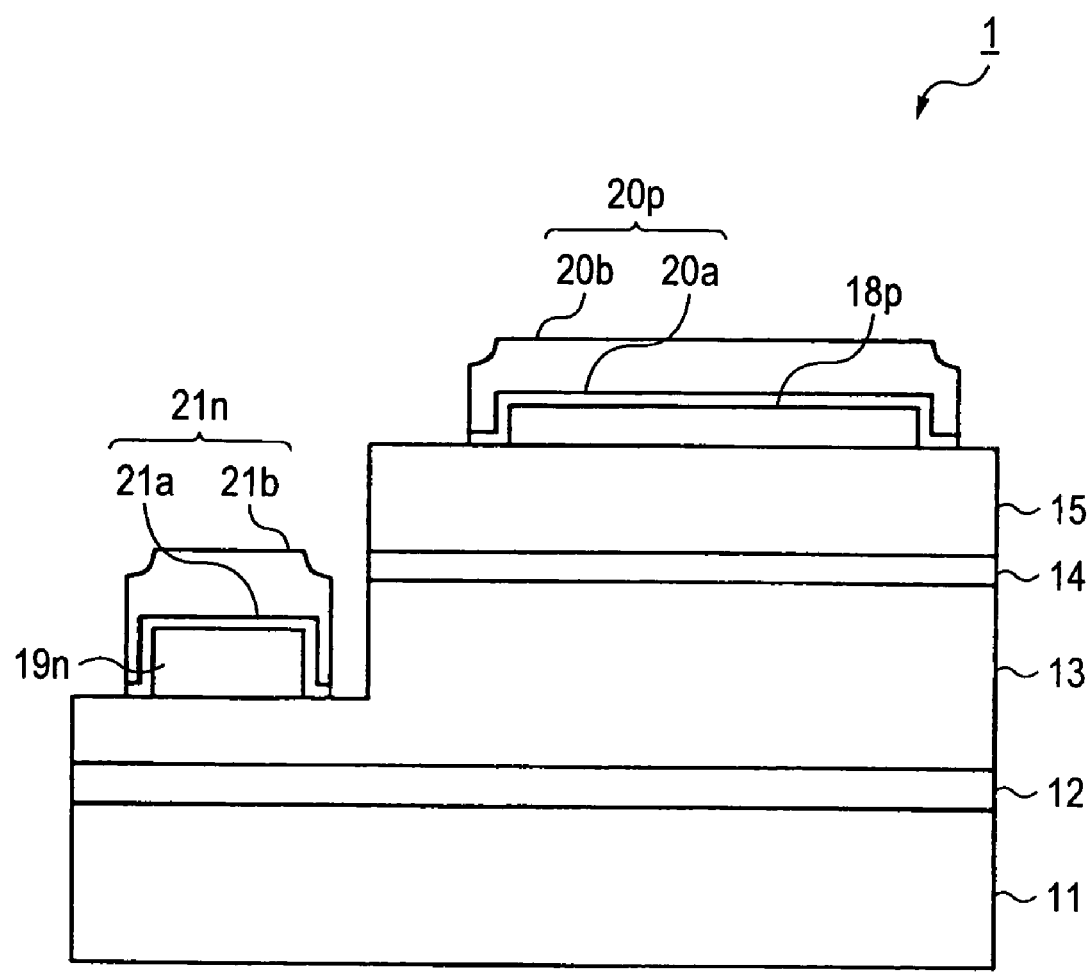
FIG. 1 is a view showing a light-emitting element as an embodiment of the invention.

A Group III nitride compound semiconductor light-emitting element according to the invention is a flip chip type light-emitting element having a p-side electrode and an n-side electrode formed on one surface side. The flip chip type light-emitting element means a light-emitting element used in a flip chip type light-emitting device, that is, a light-emitting element which is used to be mounted on a support such as a board while the surface of the light-emitting element on which the p-side electrode and the n-side electrode are formed is used as a mount surface. Emitted light is radiated from the board side, that is, from a side opposite to the surface side on which the electrodes are formed.

The Group III nitride compound semiconductor light-emitting element means a light-emitting element having a light-emitting layer made of Group III nitride compound semiconductor. Here, the Group III nitride compound semiconductor is represented by the general formula $Al_XGa_Y In_{1-X-Y}N$ ($0 \leq X \leq 1$, $0 \leq Y \leq 1$, $0 \leq X+Y \leq 1$) which expresses quaternary compounds but includes so-called binary compounds such as AlN, GaN and InN, and so-called ternary compounds such as $Al_xGa_{1-x}N$, $Al_xIn_{1-x}N$ and $Ga_xIn_{1-x}N$ (0<x<1 in the above). The Group III elements may be partially replaced by boron (B), thallium (Tl), etc. The nitrogen (N) may be partially replaced by phosphorus (P), arsenic (As), antimony (Sb), bismuth (Bi), etc. The Group III nitride compound semiconductor layer may contain any optional dopant. Si, Ge, Se, Te, C, etc. may be used as n-type impurities. Mg, Zn, Be, Ca, Sr, Ba, etc. may be used as p-type impurities.

The Group III nitride compound semiconductor layer can be formed by a known method such as a metal organic chemical vapor deposition method (MOCVD method), a molecular beam epitaxy method (MBE method), a halide vapor phase epitaxy method (HVPE method), a sputtering method, an ion-plating method, an electron showering method, etc.

Incidentally, after doped with p-type impurities, the Group III nitride compound semiconductor may be subjected to electron beam irradiation, plasma irradiation or heating due to a furnace. This is however not essential.

Respective members of the invention will be described below in more detail.

(p-Side Electrode)

A metal such as Rh, Au, Pt, Ag, Cu, Al, Ni, Co, Mg, Pd, V, Mn, Bi, Sn, Re, etc. or its alloy can be used as a material of the p-side electrode. Especially, Rh or Pt can be used as a preferred material of the p-side electrode because it has high reflection efficiency to the wavelength of light emitted from the Group III nitride compound semiconductor light-emitting element. The p-side electrode may be formed as a two-layer or multi-layer structure in which layers different in composition are laminated.

(p-Side Electrode Film)

A p-side electrode film containing Au (gold) is formed on a surface of the p-side electrode. The p-side electrode film enhances adhesion of the p-side electrode to an adhesive member of Au (hereinafter referred to as "Au bump") used at the time of mounting the light-emitting element on the support to consequently enhance bonding strength between the light-emitting element and the support.

The p-side electrode film may be formed in any manner if at least one part of the surface of the p-side electrode can be covered with the p-side electrode film. Preferably, the p-side electrode film is formed so that the surface of the p-side electrode is entirely covered with the p-side electrode film. As a result, the surface of the p-side electrode is entirely covered with the film containing Au so that corrosion resistance of the surface of the p-side electrode is improved. In addition, improvement in adhesion to the Au bump can be expected.

The p-side electrode film is preferably formed as a laminate of a plurality of layers. For example, a two-layer structure having a starting layer made of a metal selected from the group consisting of Ti, Cr, W, Mo, Ta, Zr and V or an alloy of the metal, and an upper layer made of Au or an Au alloy and formed on the starting layer is preferably used as the p-side electrode film. The starting layer mentioned here is used for enhancing adhesion between the p-side electrode surface and the upper layer (the layer made of Au or an Au alloy). Particularly preferably, Ti, Cr or V is used as the material of the starting layer because the starting layer can be formed easily by vapor deposition or the like. The material of the upper layer is preferably selected to be the same as the material of the Au bump. This is for enhancing adhesion between the two. Another layer may be formed between the starting layer and the upper layer or on the upper layer.

The film thickness of the starting layer is preferably selected to be smaller than the film thickness of the upper layer. In other words, it is preferable that a thin starting layer is formed on the surface of the p-side electrode and that a thick-film upper layer is formed on the thin starting layer. The formation of the thin starting layer suppresses increase in electric resistance due to the starting layer. The formation of the thick upper layer improves adhesion between the p-side electrode film and the Au bump. The film thickness of the starting layer is, for example, in a range of from 1 nm to 100 nm, preferably in a range of from 5 nm to 50 nm. The film thickness of the upper layer is, for example, in a range of from 0.1 $\mu$m to 50 $\mu$m, preferably in a range of from 0.3 $\mu$m to 3 $\mu$m.

(n-Side Electrode)

A metal such as Al, V, Sn, Ti, Cr, Nb, Ta, Mo, W, Hf, etc. or its alloy can be used as a material of the n-side electrode. The n-side electrode may be formed as a two-layer or multi-layer structure in which layers different in composition are laminated. For example, the n-side electrode may be formed as a two-layer structure of V and Al.

(n-Side Electrode Film)

An n-side electrode film containing Au (gold) is formed on a surface of the n-side electrode, like the p-side electrode surface. The formation of the n-side electrode film enhances adhesion (close contact) between the n-side electrode and the Au bump at the time of mounting the light-emitting element on the support by the Au bump to consequently improve bonding strength between the light-emitting element and the support.

The n-side electrode film may be formed in any manner if at least one part of the surface of the n-side electrode can be covered with the n-side electrode film. Preferably, the n-side electrode film is formed so that the surface of the n-side electrode is entirely covered with the n-side electrode film. As a result, the surface of the n-side electrode is entirely covered with the film containing Au so that corrosion resistance of the n-side electrode is improved. In addition, improvement in adhesion to the Au bump can be expected.

The n-side electrode film is preferably formed as a laminate of a plurality of layers. For example, a two-layer structure having a starting layer made of a metal selected from the group consisting of Ti, Cr, W, Mo, Ta, Zr and V or an alloy of the metal, and an upper layer made of Au or an Au alloy and formed on the starting layer is preferably used as the n-side electrode film. The starting layer mentioned here is used for enhancing adhesion between the n-side electrode surface and the upper layer (the layer made of Au or an Au alloy). Particularly preferably, Ti, Cr or V is used as the material of the starting layer because the starting layer can be formed easily by vapor deposition or the like. The material of the upper layer is preferably selected to be the same as the material of the Au bump. This is for enhancing adhesion between the two. Another layer may be formed between the starting layer and the upper layer or on the upper layer.

The film thickness of the starting layer is preferably selected to be smaller than the film thickness of the upper layer. In other words, it is preferable that a thin starting layer is formed on the surface of the n-side electrode and that a thick-film upper layer is formed on the thin starting layer. The formation of the thin starting layer suppresses increase in electric resistance due to the starting layer. The formation of the thick upper layer improves adhesion between the n-side electrode film and the Au bump. The film thickness of the starting layer is, for example, in a range of from 1 nm to 100 nm, preferably in a range of from 5 nm to 50 nm. The film thickness of the upper layer is, for example, in a range of from 0.1 $\mu$m to 50 $\mu$m, preferably in a range of from 0.3 $\mu$m to 3 $\mu$m.

The configuration of the n-side electrode film is preferably selected to the same as the configuration of the p-side electrode film. In such a mode, the n-side electrode film and the p-side electrode film can be formed simultaneously, so that the production process can be simplified. For example, each of the n-side electrode film and the p-side electrode film is formed as a structure having a starting layer of Ti, and an upper layer of Au laminated on the starting layer.

For example, the Group III nitride compound semiconductor element light-emitting element according to the invention can be produced as follows.

First, a substrate on which Group III nitride compound semiconductor layers can be grown is prepared. A plurality of semiconductor layers are laminated on the substrate so that at least an n-type Group III nitride compound semiconductor layer, a light-emitting layer of Group III nitride compound semiconductor and a p-type Group III nitride compound semiconductor layer are arranged in order. Sapphire, spinel, silicon, silicon carbide, zinc oxide, gallium phosphide, gallium arsenide, magnesium oxide, manganese oxide, Group III nitride compound semiconductor single crystal, etc. can be used as the substrate. When a sapphire substrate is used, a face a of the substrate is preferably used.

Then, an etching process is applied to reveal a part of the n-type semiconductor layer. Then, a p-side electrode and an n-side electrode are formed on the p-type Group III nitride compound semiconductor layer and on the n-type Group III nitride compound semiconductor layer respectively. The p-side electrode and the n-side electrode can be formed by a known method such as vapor deposition, sputtering, etc. Then, a surface of the sample is cleaned. Examples of the cleaning method include heating, ultraviolet-ray irradiation, etc. When the sample surface, especially a surface of the n-electrode is cleaned, sufficient bonding strength can be kept between the n-side electrode and an n-side electrode film. Then, a p-side electrode film is formed on a surface of the p-side electrode. Similarly, an n-side electrode film is formed on a surface of the n-side electrode. Each of the p-side electrode film and the n-side electrode film can be formed by a known method such as vapor deposition, sputtering, etc. When the p-side electrode film and the n-side electrode are selected to be equal in configuration to each other, the p-side electrode film and the n-side electrode film can be formed simultaneously.

<Embodiment>

The configuration of the invention will be described below in more detail in connection with an embodiment of the invention.

FIG. 1 is a view typically showing the configuration of a light-emitting element 1 as an embodiment. Specifications of respective layers in the light-emitting element 1 are as follows.

| Layer | Composition |
|---|---|
| p-type layer 15 | p-GaN: Mg |
| Layer 14 containing a light-emitting layer | inclusive of InGaN layer |
| n-type layer 13 | n-GaN: Si |
| Buffer layer 12 | AlN |
| Substrate 11 | sapphire |

An n-type layer 13 of GaN doped with Si as n-type impurities is formed on a substrate 11 with interposition of a buffer layer 12. Although sapphire is used as the substrate 11 here, the substrate 11 is not limited thereto. Sapphire, spinel, silicon, silicon carbide, zinc oxide, gallium phosphide, gallium arsenide, magnesium oxide, manganese oxide, Group III nitride compound semiconductor single crystal, etc. may be used. Although the buffer layer is made of AlN by an MOCVD method, the buffer layer is not limited thereto. GaN, InN, AlGaN, InGaN, AlInGaN, etc. may be used as the material of the buffer layer. A molecular beam epitaxy method (MBE method), a halide vapor phase epitaxy method (HVPE method), a sputtering method, an ion-plating method, an electron showering method, etc. may be used as the method for producing the buffer layer. When Group III nitride compound semiconductor is used as the substrate, the buffer layer can be omitted.

Furthermore, after the semiconductor element is formed, the substrate and the buffer layer may be removed as occasion demands.

Although the n-type layer is made of GaN here, AlGaN, InGaN or AlInGaN may be used.

Although the n-type layer is doped with Si as n-type impurities, other n-type impurities such as Ge, Se, Te, C, etc. may be used.

The n-type layer 13 may be of a two-layer structure having an n– layer of low electron density on the light-emitting layer-containing layer 14 side, and an n+ layer of high electron density on the buffer layer 12 side.

The layer 14 containing a light-emitting layer may contain a light-emitting layer of a quantum well structure. A single hetero type structure, a double hetero type structure, a homo-junction type structure, etc. may be used as the structure of the light-emitting element.

The layer 14 containing a light-emitting layer may contain a Group III nitride compound semiconductor layer doped with an acceptor such as magnesium etc. and formed on the p-type layer 15 side so as to have a wide band gap. This is provided for effectively preventing electrons injected into the layer 14 containing a light-emitting layer from diffusing into the p-type layer 15.

A p-type layer 15 of GaN doped with Mg as p-type impurities is formed on the layer 14 containing a light-emitting layer. The p-type layer may be made of AlGaN, InGaN or InAlGaN. Zn, Be, Ca, Sr or Ba may be used as p-type impurities.

The p-type layer 15 may be of a two-layer structure having a p– layer of low hole density on the layer 14 containing a light-emitting layer side, and a p+ layer of high hole density on the electrode side.

In the light-emitting diode configured as described above, each Group III nitride compound semiconductor layer may be formed by MOCVD executed in a general condition or may be formed by a method such as a molecular beam epitaxy method (MBE method), a halide vapor phase epitaxy method (HVPE method), a sputtering method, an ion-plating method, an electron showering method, etc.

After the p-type layer 15 is formed, the p-type layer 15, the layer 14 containing a light-emitting layer and the n-type layer 13 are partially removed by etching to reveal a part of the n-type layer 13.

Then, a p-electrode 18 of Rh is formed on the p-type layer 15 by vapor deposition. An n-electrode 19, which is composed of two layers of Al and V, is formed on the n-type layer 13 by vapor deposition. Then, alloying is performed by known means.

Each of a p-side electrode film 20 and an n-side electrode film 21 is composed of a starting layer 20a or 21a of Ti, and an upper layer 20b or 21b of Au laminated on the starting layer 20a or 21a. Each of the p-side electrode film 20 and the n-side electrode film 21 is formed by a lift-off method. In this embodiment, the film thickness of each of the starting layers 20a and 21a is set at 10 nm, and the film thickness of each of the upper layers 20b and 21b is set at 1 μm.

After the aforementioned process, a process of separation into chips is carried out by using a scriber or the like.

Figure 2:
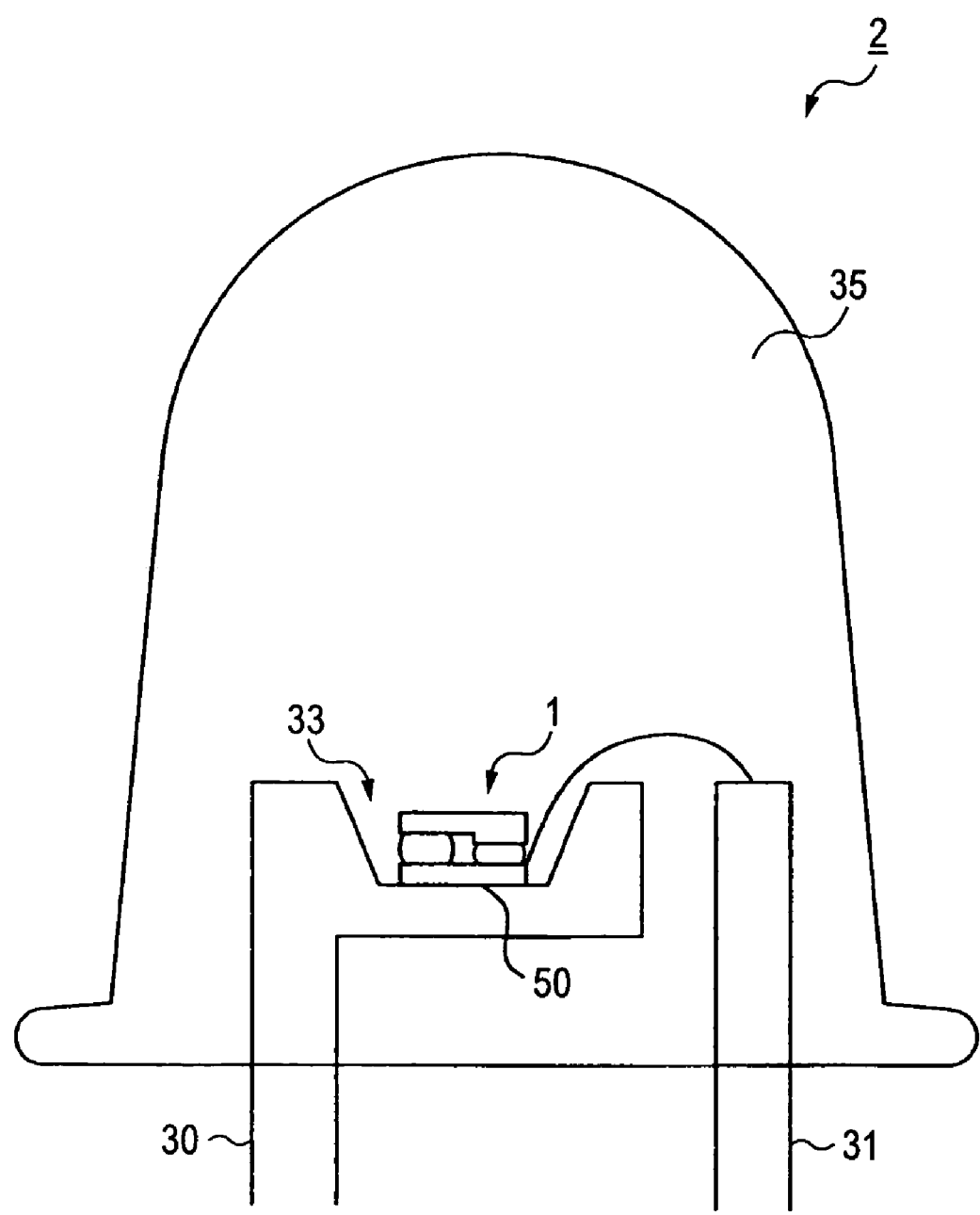
FIG. 2 is a view showing an LED formed by using the light-emitting element.
Figure 3:
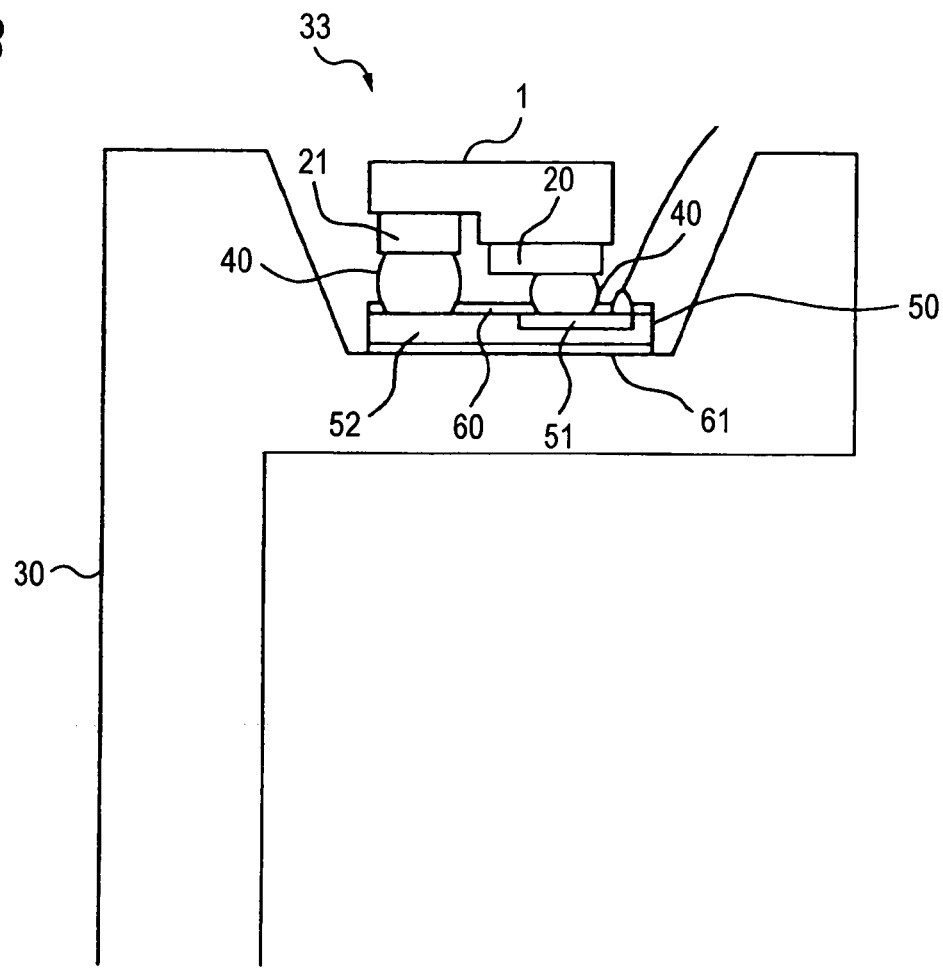
FIG. 3 is an enlarged view of the neighborhood of a cup-like portion in the LED.

Next, an example of a light-emitting device formed by using the light-emitting element 1 will be described. FIG. 2 shows a flip chip type LED 2 using the light-emitting element 1. The LED 2 generally includes the light-emitting element 1, lead frames 30 and 31, a sub-mount board 50 as a support, and a sealing resin 35. A mode of mounting of the light-emitting element 1 will be described below with reference to an enlarged view (FIG. 3) of the neighborhood of a cup-like portion 33 in the lead frame 30.

The light-emitting element 1 is mounted on the cup-like portion 33 of the lead frame 30 with interposition of the sub-mount board 50. The board 50 has a p-type region 51, and an n-type region 52. An electrically insulating film 60 of $SiO_2$ is formed on a surface of the board 50 except portions on which Au bumps 40 are formed. As shown in the drawing, when the light-emitting element 1 having its electrode side face downward is sub-mounted on the board 50, the p-side electrode film 20 is connected to the p-type region 51 of the board 50 through one of the Au bumps while the n-side electrode film 21 is likewise connected to the n-type region 52 of the board 50 through the other Au bump. As a result, the p-electrode 18 and the n-electrode 19 of the light-emitting element 1 are electrically connected to the p-type region 51 and the n-type region 52 of the board 50 respectively while the light-emitting element 1 is fixed to the board 50. The board 50 is bonded and fixed to the cup-like portion 33 of the lead frame 30 by silver paste 61 while a surface of the board 50 opposite to the surface on which the light-emitting element 1 is mounted is used as an adhesive surface.

Figure 4:
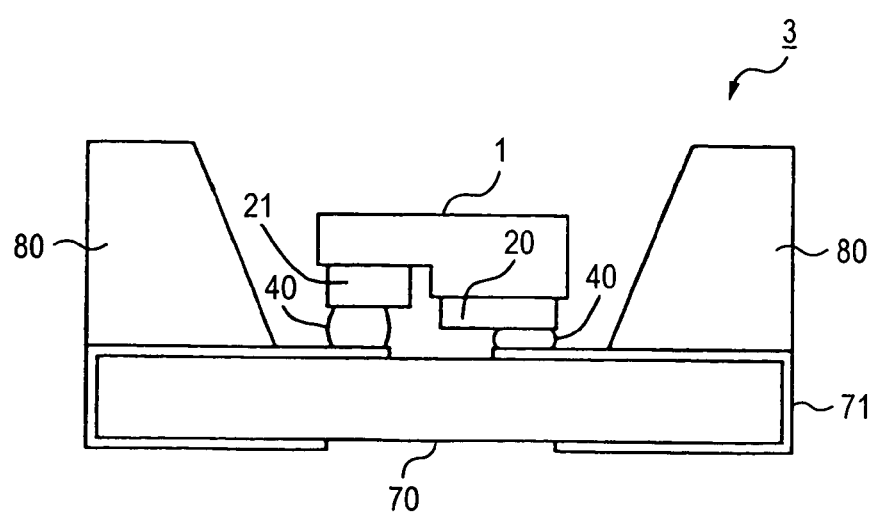
FIG. 4 is a view showing an SMD type LED formed by using the light-emitting element.

FIG. 4 shows another type light-emitting device (LED 3) formed by using the light-emitting element 1. The LED 3 is an SMD (Surface Mount Device) type LED. Incidentally, parts the same as those in the LED 2 are denoted by the same reference numerals.

The LED 3 includes the light-emitting element 1, a board 70 as a support, and a reflecting member 80. The light-emitting element 1 is mounted on the board 70 while the electrode side of the light-emitting element 1 is used as a mount surface in the same manner as in the LED 2. Wiring patterns 71 are formed on surfaces of the board 70. When the p-side electrode film 20 and the n-side electrode film 21 of the light-emitting element 1 are bonded to the wiring patterns through the Au bumps 40, the two electrodes of the light-emitting element 1 are electrically connected to the wiring patterns. The reflecting member 80 is disposed on the board 70 so that the light-emitting element 1 is surrounded by the reflecting member 80. The reflecting member 80 is made of a white resin, so that a surface of the reflecting member 80 can highly efficiently reflect light radiated from the light-emitting element 1.

Although the invention has been described in detail and with reference to a specific embodiment, it is obvious to those skilled in the art that various changes or modifications may be made without departing from the spirit and scope of the invention.

This application is based on Japanese Patent Application (Japanese Patent Application No. 2001-170908) filed on Jun. 6, 2001. The contents thereof must be incorporated herein by reference.

INDUSTRIAL APPLICABILITY

The invention is not limited to the description of mode for carrying out the invention at all. Various modifications that can be easily conceived by those skilled in the art are also included in the invention without departing from the scope of Claim.

The following items are disclosed.

11. A Group III nitride compound semiconductor light-emitting element having a p-side electrode and an n-side electrode formed on one surface side, the light-emitting element further having a p-side electrode film containing Au and formed on a surface of the p-side electrode, and an n-side electrode film containing Au and formed on a surface of the n-side electrode, wherein the p-side electrode is made of a metal or two or more metals selected from the group consisting of Rh, Au, Pt, Ag, Cu, Al, Ni, Co, Mg, Pd, V, Mn, Bi, Sn and Re, or an alloy or alloys of the metal or metals.

12. A Group III nitride compound semiconductor light-emitting element having a p-side electrode and an n-side electrode formed on one surface side, the light-emitting element further having a p-side electrode film containing Au and formed on a surface of the p-side electrode, and an n-side electrode film containing Au and formed on a surface of the n-side electrode, wherein the n-side electrode is made of a metal or two or more metals selected from the group consisting of Al, V, Sn, Ti, Cr, Nb, Ta, Mo, W and Hf, or an alloy or alloys of the metal or metals.

21. A method of producing a flip chip type Group III nitride compound semiconductor light-emitting element having a p-side electrode and an n-side electrode formed on one surface side, including the steps of:

forming a p-side electrode film containing Au on the p-side electrode; and forming an n-side electrode film containing Au on the n-side electrode.

22. A producing method according to 21, further including the step of cleaning a surface of the n-side electrode before the n-side electrode film is formed.

23. A producing method according to 21 or 22, wherein the step of forming the p-side electrode film includes the steps of:
   forming a starting layer on the p-side electrode, the starting layer being made of a metal selected from the group consisting of Ti, Cr, W, Mo, Ta, Zr and V, or an alloy of the metal; and
   forming an upper layer made of Au or an Au alloy.
24. A producing method according to any one of 21 to 23, wherein the step of forming the n-side electrode film includes the steps of:
   forming a starting layer on the n-side electrode, the starting layer being made of a metal selected from the group consisting of Ti, Cr, W, Mo, Ta, Zr and V, or an alloy of the metal; and
   forming an upper layer made of Au or an Au alloy.
25. A producing method according to any one of 21 to 24, wherein the step of forming the upper layer in the step of forming the p-side electrode film and the step of forming the upper layer in the step of forming the n-side electrode film are carried out simultaneously.
26. A producing method according to any one of 21 to 25, wherein the p-side electrode film is formed so that a surface of the p-side electrode is entirely covered with the p-side electrode film.
27. A producing method according to any one of 21 to 26, wherein the n-side electrode film is formed so that a surface of the n-side electrode is entirely covered with the n-side electrode film.

What is claimed is:

1. A Group III nitride compound semiconductor light-emitting element comprising a p-side electrode and an n-side electrode formed on one surface side, said Group III nitride compound semiconductor light-emitting element further comprising:
   a p-side electrode film comprising Au and formed on a surface of said p-side electrode, said p-side electrode film entirely covering said p-side electrode; and
   an n-side electrode film comprising Au and formed on a surface of said n-side electrode,
   wherein said p-side electrode film comprises an upper layer comprising at least one of Au and an Au alloy,
   wherein said n-side electrode comprises an upper layer comprising at least one of Au and an Au alloy, and
   wherein a thickness of each of said upper layers is substantially the same.
2. A Group III nitride compound semiconductor light-emitting element according to claim 1, wherein said p-side electrode film comprises a plurality of layers comprising a starting layer, and the upper layer formed on said starting layer, said starting layer comprising at least one of a metal selected from the group consisting of Ti, Cr, W, Mo, Ta, Zr and V, and an alloy of said metal.
3. A Group III nitride compound semiconductor light-emitting element according to claim 2, wherein said starting layer comprises at least one of Ti and a Ti alloy.
4. A Group III nitride compound semiconductor light-emitting element according to claim 1, wherein said n-side electrode film comprises a plurality of layers comprising a starting layer, and the upper layer formed on said starting layer, said starting layer comprising at least one of a metal selected from the group consisting of Ti, Cr, W, Mo, Ta, Zr and V, and an alloy of said metal.
5. A Group m nitride compound semiconductor light-emitting element according to claim 4, wherein said starting layer comprises at least one of Ti and a Ti alloy.
6. A Group III nitride compound semiconductor light-emitting element according to claim 1, wherein said p-side electrode film and said n-side electrode film comprise the same layer structure.
7. A Group III nitride compound semiconductor light-emitting element according to claim 1, wherein said n-side electrode film entirely covers said n-side electrode.
8. A Group III nitride compound semiconductor light-emitting element according to claim 1, wherein said p-side electrode comprises at least one of a metal selected from the group consisting of Rh, Pt, Ag, Cu, Al, Co, Mg, Pd, V. Mn, Bi, Sn, and Re, and an alloy of said metal.
9. A Group III nitride compound semiconductor light-emitting element according to claim 1, wherein said p-side electrode comprises at least one of a metal selected from the Group consisting of Rh and Pt.
10. A light-emitting device comprising:
    a Group III nitride compound semiconductor light-emitting element comprising:
    a p-side electrode;
    an n-side electrode formed on one surface side;
    a p-side electrode film comprising Au and formed on a surface of said p-side electrode, said p-side electrode film entirely covering said p-side electrode; and
    an n-side electrode film comprising Au and formed on a surface of said n-side electrode; and
    a support on which said light-emitting element is mounted,
    wherein said p-side electrode film comprises an upper layer comprising at least one of Au and an Au alloy,
    wherein said n-side electrode film comprises an upper layer comprising at least one of Au and Au alloy, and
    wherein a thickness of each of said upper layers is substantially the same.
11. A light-emitting device according to claim 10, wherein said light-emitting element is mounted on said support through Au bumps.
12. A light-emitting device according to claim 10, wherein said support comprises a board comprising a p-side region connected to said p-side electrode, and an n-side region connected to said n-side electrode.
13. A light-emitting device according to claim 10, wherein said support comprises a board comprising wiring patterns connected to said p-side electrode and said n-side electrode.
14. A light-emitting device according to claim 10, wherein said p-side electrode film comprises a plurality of layers comprising a starting layer, and the upper layer formed on said starting layer,
    wherein said starting layer comprises at least one of a metal selected from the group consisting of Ti, Cr, W, Mo, Ta, Zr and V, and an alloy of said metal.
15. A Group III nitride compound semiconductor light-emitting device according to claim 14, wherein said starting layer comprises at least one of Ti and a Ti alloy.
16. A light-emitting device according to claim 14, further comprising a bump on which said light-emitting element is mounted on, said upper layer and said bump comprise the same material.
17. A light-emitting device according to claim 10, wherein said n-side electrode film comprises a plurality of layers comprising a starting layer, and the upper layer formed on said starting layer, said starting layer comprising at least one of a metal selected from the group consisting of Ti, Cr, W, Mo, Ta, Zr and V, and an alloy of said metal.

18. A light-emitting device according to claim 17, wherein said starting layer comprises at least one of Ti and a Ti alloy.

19. A light-emitting device according to claim 17, further comprising a bump on which said light-emitting element is mounted on, said upper layer and said bump comprise the same material.

20. A light-emitting device according to claim 10, wherein said p-side electrode film and said n-side electrode film comprise the same layer structure.

21. A light-emitting device according to claim 10, wherein said n-side electrode film entirely covers said n-side electrode.

* * * * *